United States Patent [19]

Busby et al.

[11] Patent Number: 4,918,325
[45] Date of Patent: Apr. 17, 1990

[54] FAST RISETIME PULSE POWER SYSTEM

[75] Inventors: Kenneth O. Busby; Richard J. Adler, both of Albuquerque; Lynn M. Miner, Kirtland; Gerald F. Kiuttu, Albuquerque, all of N. Mex.

[73] Assignee: The United States of America as represented by the Secretary of the Air Force, Washington, D.C.

[21] Appl. No.: 282,358

[22] Filed: Dec. 8, 1988

[51] Int. Cl.$^4$ .......................... H03K 3/00; H01B 7/00
[52] U.S. Cl. ................... 307/106; 174/124 R
[58] Field of Search ...................... 307/106, 268, 263; 174/122 R, 124 R

[56] References Cited

U.S. PATENT DOCUMENTS

| 4,494,011 | 1/1985 | Davis | 307/106 |
| 4,546,268 | 10/1985 | Caldwell et al. | 307/265 |
| 4,549,091 | 10/1985 | Fahlen et al. | 307/106 |
| 4,594,472 | 6/1986 | Brettle et al. | 174/35 GC |

Primary Examiner—William M. Shoop, Jr.
Assistant Examiner—Sharon D. Logan
Attorney, Agent, or Firm—William G. Auton; Donald J. Singer

[57] ABSTRACT

A pulse sharpening circuit is disclosed for decreasing the current and voltage risetimes of pulse power devices. It is useful in many systems ranging from the particle beam fusion accelerator to field emission electron guns for intense microwave sources requiring an extremely quick high power turn-on for proper operation. A polyvinyl chloride dielectric flashover switch is used in combination with a velvet covered transmission line which has a metal ring near its end to produce switching when the initial radial electron flow is diverted to axial electron flow as the critical magnetic insulation current is exceeded. Nominal peak voltages of 500 Kv have been obtained with current and voltage risetimes of 0.5 nanoseconds.

5 Claims, 6 Drawing Sheets

_Fig.7_

_Fig.8_

FAST RISETIME PULSE POWER SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to electric power supply systems, and more specifically to a pulse sharpening circuit for decreasing the current and voltage risetimes of pulse power devices. It is useful in many systems ranging from the particle beam fusion accelerator, field emission electron guns, and intense microwave sources requiring an extremely quick high power turn-on for proper operation.

Modern lasers, electron gun systems, and radar devices use electrical power supplies that include pulse generators that supply high voltage (around 500 kV) for high repetition, fast risetime electrical pulses. Gas laser systems rely on such pulse generators to provide electrical pulses to excite a gas mixture to excited energy states for stimulated emission. Unfortunately, most commonly achieved risetimes range between 5 to 20 nanoseconds.

The task of enhancing the risetimes of pulse generator system is alleviated, to some extent, by the systems disclosed in the following U.S. Patents, the disclosures of which are specifically incorporated herein by reference:

U.S. Pat. No. 4,494,011 issued to Davis;
U.S. Pat. No. 4,546,268 issued to Caldwell et al; and
U.S. Pat. No. 4,549,091 issued to Fahlen et al.

Fahlen et al disclose an excitation circuit for gas lasers which includes a cascaded magnetic charging circuit formed with saturable inductor switches. The saturable inductor switch and magnetic diode charging inductor includes a polyvinyl chloride tube as part of a saturable switch.

The Davis reference has a high voltage pulse generator which provides pulse voltages in the kilovolt range with risetimes to 200 picoseconds. Caldwell et al disclose a transistor circuit capable of generating sub-nanosecond pulses.

Both the Davis ad Caldwell pulse generators are superior in risetime performance to conventional pulse generators. However, both of these prior art systems are complex alternatives to existing pulse generators, rather than improvements made to existing systems. The Davis system uses a high voltage avalanche source, a plurality of biased triode amplifier tubes and circuits and a voltage step-down transformer between any two consecutive tube stages to form a new pulse generator.

From the foregoing discussion, it is apparent that there remains a need to enhance the risetime performance of existing pulse generators, and to enable them to supply pulses with high voltage and high power with subnanosecond current and voltage risetimes. The present invention is intended to satisfy that need.

SUMMARY OF THE INVENTION

The present invention is a system which decreases the current and voltage risetimes of existing pulse generators to subnanosecond time periods. One embodiment of the invention electrically connects a pulse generator to an electrical load using a coaxial transmission line with inner and outer conductors, a polyvinyl chloride dielectric flashover switch, a metal ring, and velvet electrical insulation between the inner and outer conductions of the transmission line.

The outer conductor (anode) is directly connected between the pulse generator and the load. The inner conductor has two sections with the polyvinyl chloride (PVC) switch fixed such that it electrically connects the two sections together. The first section of the velvet-covered inner conductor electrically connects the pulse generator to the PVC switch. The second section of the velvet covered inner conductor electrically connects the PVC switch to the load. The metallic ring circumscribes the outer conductor of the transmission line near the end that is connected with the load.

In operation, the system described above has been used with a conventional pulse generator which normally supplies 500 kV with current and voltage risetimes ranging between 5 to 20 nanoseconds. The system described above was able to decrease the current and voltage risetime to 0.5 nanoseconds. The reasons for this improvement in performance are described briefly below.

Both the upstream flashover switch/velvet combination and the metallic ring work as Magnetic Insulation Diversion (MID) switches, because the initial radial electron flow is diverted to axial electron flow when the critical magnetic insulation current is exceeded. This diversion of initial radial electron flow to axial flow in the transmission line is due partially to the use of velvet insulation between the inner and outer conductors. Velvet is used because the electric field required for electron emission is 50 kV/cm. From the pulse generator, a 20 to 25 ns risetime current pulse is introduced into the velvet covered magnetically insulated pulse line. The transmission line supplies the load with the 500 kV pulse with a current and voltage risetime reduced to 0.5 nanoseconds.

It is an object of the present invention to provide a means of improving the performance of existing pulse generator systems.

It is another object of the present invention to provide a means of supplying high voltage pulses with subnanosecond current and voltage risetimes.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a pulse risetime enhancing system for use with conventional pulse generators in order to decrease the current and voltage risetimes of pulse power devices to 0.5 ns.

Figure 1:
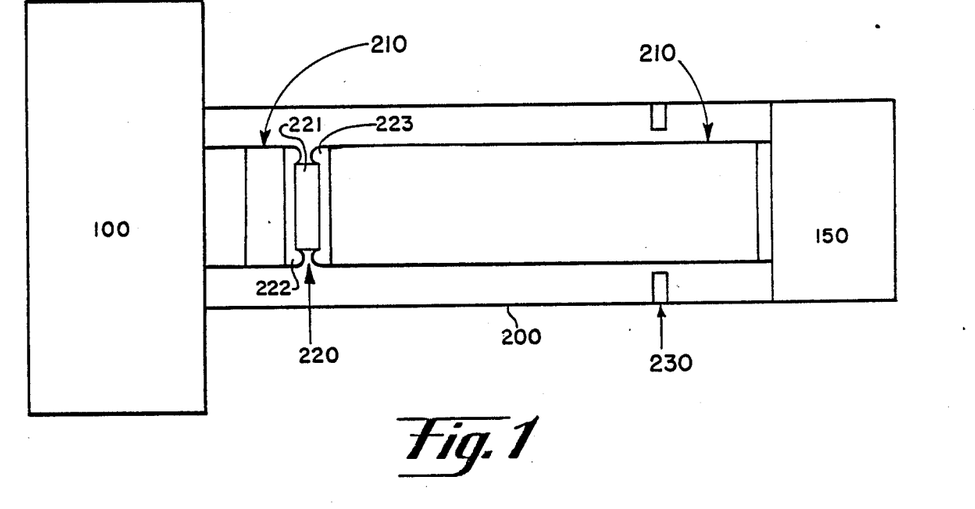
FIG. 1 is an illustration of an embodiment of the invention.

The reader's attention is now directed towards FIG. 1, which is an illustration of the preferred embodiment of the present invention. The system of FIG. 1 electrically connects a conventional pulse generator 100 to a load 150 using: a transmission line having an outer conductor 200, a velvet-covered inner conductor 210, a polyvinyl chloride (PVC) dielectric flashover switch 220, and an aluminum ring 230 which circumscribes the outer conductor 200 near the load 150. This system operates as follows. From the left, a 20 to 25 ns risetime current pulse is introduced into the velvet covered magnetically insulated pulse line 210. Velvet is used because the electric field required to electron emission is only 50 kV/cm. The diameters of the inner and outer conductors are 10.2 cm and 19.7 cm. respectively, to obtain a nominal 20 ohm (including electron effects) impedance. As the pulse is passed through the first 20.3 cm section of velvet covered pulse line 210 and the 8.9 cm long, 7.6 cm diameter PVC switch 230, the 10% to 90% current risetime is sharpened to less than 3 ns. Passing this pulse through 2.2 meters of velvet covered pulse line sharpens the pulse further to 1.5 ns (10% to 90% current risetime). If a metallic ring 230 with the dimensions of 15.2 cm inner diameter and 1.3 thickness is placed near the end of the pulse line, the 10% to 90% current risetime is 500 ps.

The principle behind the success of the present invention is as follows. Both the upstream flashover switch/velvet combination and the metallic ring work as Magnetic Insulation Diversion (MID) switches. The decrease in the current and voltage risetime of the pulse from the pulse generator occurs because the initial radial electron flow in the transmission line is diverted to axial electron flow when the critical magnetic insulation current is exceeded. The selection of velvet as the insulator between the inner conductor and the outer conductor is used because the electric field required for electron emission is only 50 kV/cm.

As indicated in FIG. 1, the velvet-covered inner conductor 210 has two sections which are electrically connected together by the polyvinyl chloride (PVC) flashover switch 220. The first section of the velvet-covered inner conductor electrically connects the pulse generator 100 to the PVC switch 220.

For the example provided above, the pulse generator produces a high power voltage pulse (around 500 kV) with a conventional current and voltage risetime ranging between 5 and 20 nanoseconds. As described above, the first section of the velvet-covered inner conductor 210 sharpens the risetime to about three nanoseconds by diverting the initial radial flow of the pulse into an axial flow along the transmission line.

The PVC switch 220 acts as a current diversion switch. It has a center section 221 made from 7.6 cm PVC solid rod stock with a typical length ranging from 8.9 cm to 10.2 cm. Two corona rings 222 and 223 connect the center section 221 with the velvet-covered cathode 210. These corona rings have an 0.634 cm radius of curvature and extend about 2.5 cm over the PVC rod 221 on either end.

The second section of the velvet-covered inner conductor receives the sharpened pulse from the PVC switch 220, and decreases the risetime down to 500 picoseconds, in the manner described above. While the system in FIG. 1 depicts the second section as being connected to the load 150, it could also be connected to another PVC switch which, in turn, could retransmit the pulse to a third section of velvet-covered inner conductor. Each section of velvet-covered inner conductor, in such a series, would connect with a current diversion switch which could sequentially send, a sharpened pulse with an improved risetime downstream. In this manner, the invention is able to decrease the risetimes of conventional pulse generators by an active transmission line which diverts the initial radial flow of pulses into an axial flow of current.

The present invention is capable of improving the current risetime of conventional pulse generators using two extensions of magnetically insulated transmission line (MITL) technology. The first is the fast opening diverter switch which uses the self magnetic field of the radial electron flow to redirect the current down the axis with a current risetime of approximately 3–5 ns. The second extension is to cover the cathode of a line with velvet. The theory which explains the resulting pulse sharpening in such magnetically insulated transmission line systems is discussed below. From this theory, one will observe that the erosion of the pulse is due to radial electron field emission before the current has built up to the threshold of self-magnetic insulation. With velvet, the minimum electric field required for field emission is lower (approximately 50 kV/cm), and thus the erosion turns on quicker. The theoretical limit to this technique is when the beam nose becomes comparable to half the anode-cathode spacing in the MITL, which is approximately. 0.1 ns.

Figure 2:
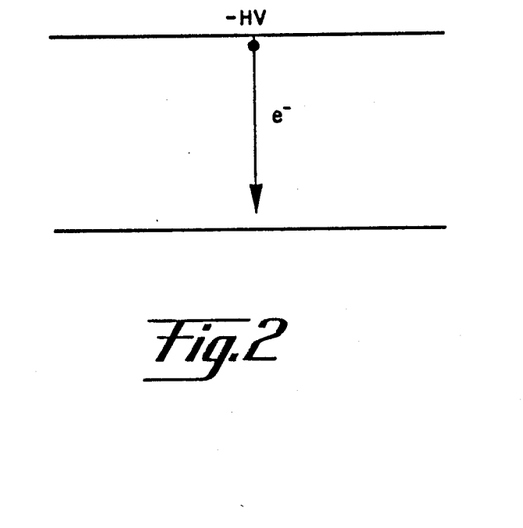
FIG. 2 is an illustration of the geometry of non-relativistic electron emission from a planar diode.

The earliest work on electron emission from voltage stressed incandescent solids was concerned with electron thermionic emission from solids, but their results are widely applicable to non-relativistic electron emission in general. For the geometry shown in FIG. 2, the maximum electron emission is given by:

$$J = 2.34 \times 10^3 \frac{V}{d^2}^{3/2} \text{ A/cm}^2 \qquad (1)$$

where V is in MV and d is in centimeters. Physically, Equation 1 gives the current density at which the electric field at the cathode is zero when no positive ions are present. Less current can be emitted whenever the source is limited to fewer electrons than that given by Equation 1. Whenever positive ions are present to partially or totally cancel the electron space charge at the cathode, or if a plasma partially fills the anode-cathode gap, the electron current can be higher than that predicted by Equation 1.

Thermionic (heated) sources can supply electron current densities of typically 1–20 A/cm² and as high as 50–100 A/cm². These sources are not easy to use and their current densities are generally too low for pulse power applications. An alternate electron source is field emission or, alternately, explosive plasma formation. Basically, the way field emission works is that, when electronically stressed, small, thin whiskers on the cathode begin emitting electrons first due to their enhanced electric field. These whiskers, which are present in all materials, heat up and explode, filling the areas among the whiskers with plasma. Then the impressed electric field extracts electrons from this plasma. Unfortunately this plasma keeps expanding at a rate of typically 1–6 cm/s until the anode-cathode gap is filled (or closed).

Figure 3A:
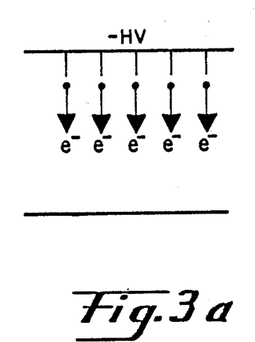
FIGS. 3a-3c are illustrations of explosive plasma formation.
Figure 3B:
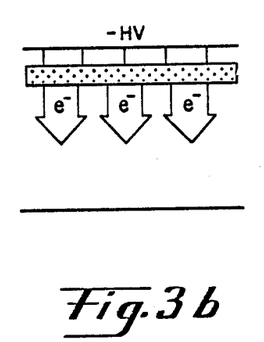
Figure 3C:
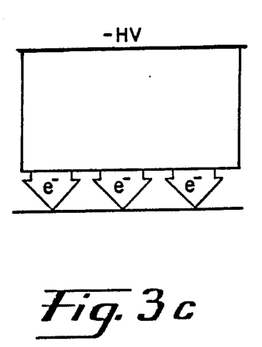

FIGS. 3a–3c are illustrations which depict explosive plasma formation between a cathode and ground at: an early time (FIG. 3a) during pulse transmission; and intermediate time during pulse transmission (FIG. 3b); and towards the end of the pulse transmission (FIG. 3c). Generally a 0.3–1 MV/cm electric field is required for field emission from metals, but recently it was discovered that cloth velvet will emit at approximately 50 kV/cm. Thus field emission can occur at lower voltage and with wider A-K (anode-cathode) gaps when velvet is the cathode material. Other studies have shown that electron field emission from velvet turns on less than 1 ns and has high brightness.

Figure 4:
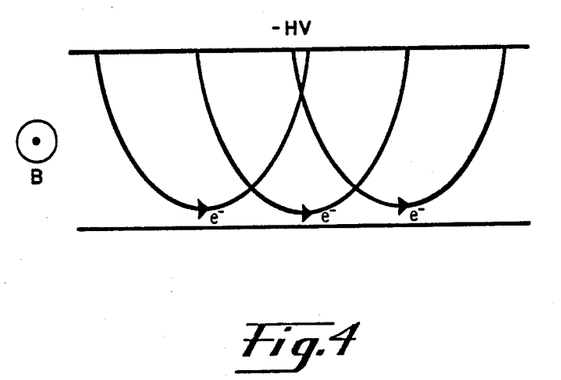
FIG. 4 is an illustration of the effect of magnetic insulation on the electron flow between a cathode and an anode.

The present invention implements the concept of magnetic insulation as follows. FIG. 4 is an illustration which depicts the effect of magnetic insulation on the electron flow between a cathode and an anode. Basically, this concept is to place a magnetic field transverse to the expected electron flow, as shown in FIG. 4, to inhibit the electrons from reaching the anode. Magnetic insulation occurs when negligible electron current reaches the anode. This effect is achieved in the present invention by the use of cloth velvet on the cathode. The effects of such magnetic insulation include the sharpening of the pulse front, as described below.

Figure 5A:
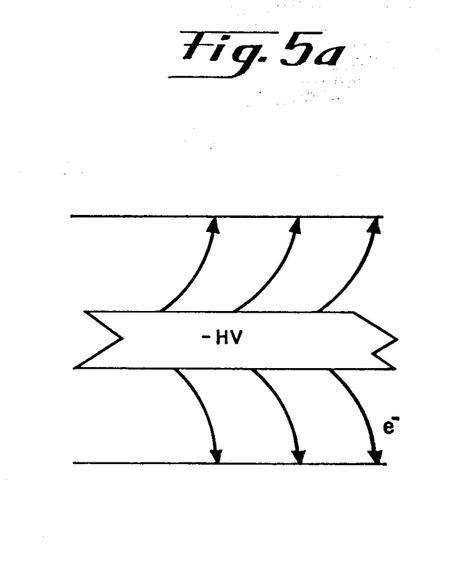
FIGS. 5a-5c are illustrations of single electron trajectories in uninsulated, and magnetically insulated lines.
Figure 5B:
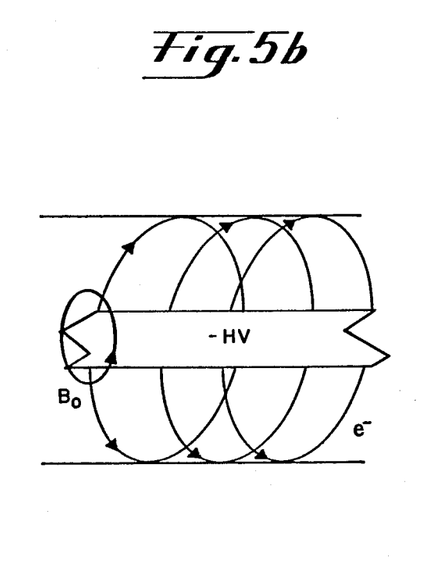
Figure 5C:
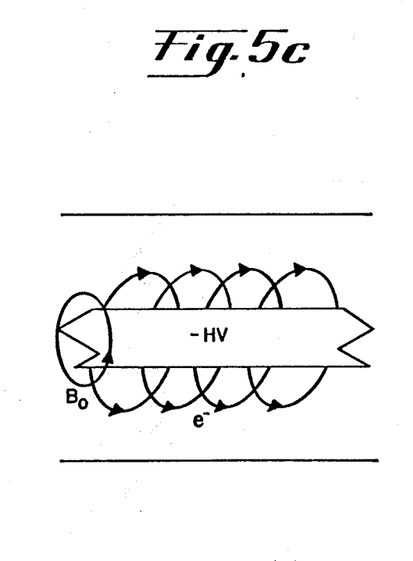

FIGS. 5a–5c are illustrations depicting single electron trajectories in: uninsulated transmission lines (FIG. 5a); transmission lines with marginal magnetic insulation (FIG. 5b); and a transmission line with good magnetic insulation (FIG. 5c).

Electron trajectories in the case of single electrons or low electron space-charge is presented in FIGS. 5a–5c. If electrons can be emitted from the cathode freely and if there is a zero magnetic field, the electrons will obviously be accelerated across the gap and impact on the anode wall of the coaxial line. When a magnetic field is impressed (either by external field coils or by a self field generated by the transmission line current), the MITL is marginally insulated if the Larmor radius of the electrons is slightly less than the anode-cathode gap and well insulated if the electron Larmor radius is much smaller than the anode-cathode gap.

Figure 6A:
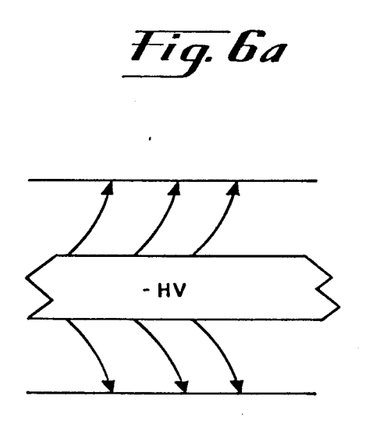
FIGS. 6a-6c are illustration of electron trajectories in high space-charge for uninsulated lines and for magnetically insulated transmission lines.
Figure 6B:
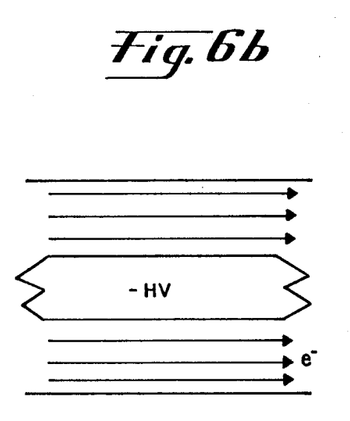
Figure 6C:
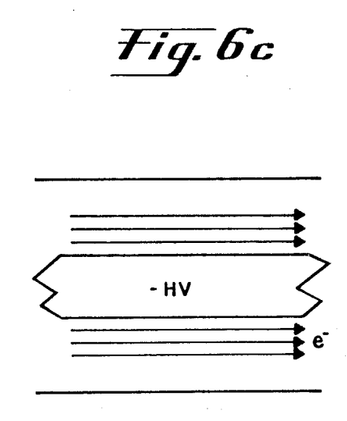

FIGS. 6a–6c are illustrations depicting electron trajectories in high space-charge uninsulated and magnetically insulated transmission lines. In these figures, the electron flow is illustrated for the case of high electron space charge. For uninsulated transmission lines, the radial electron flow is governed by Child-Langmuir space-charge limited flow (Equation 1). As before, the definitions of marginally and well insulated are based upon how closely the electron flow approaches the anode wall. Instead of the large cycloidal orbits of FIGS. 5a–5c, the electrons tend to flow along equipotential lines (parapotential flow).

Figure 7:
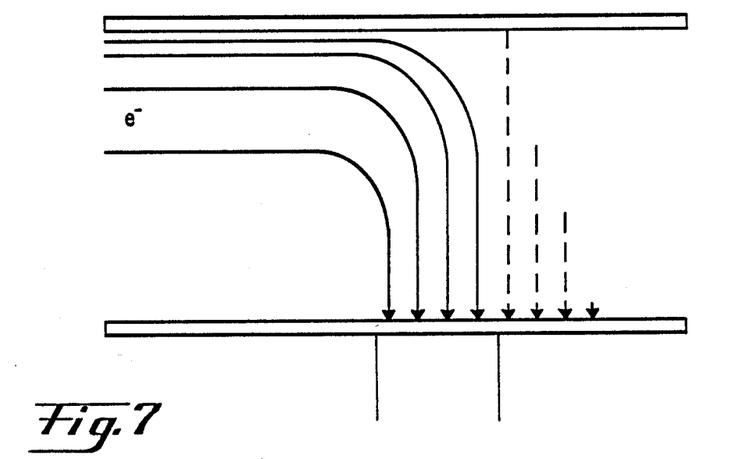
FIG. 7 is an illustration which shows how a magnetically insulated transmission line decreases the pulse front risetime.

FIG. 7 presents an illustration of how a MITL decreases the pulse front risetime. The pulse propagates from left to right. Before explosive plasma formation occurs and electrons are emitted from the cathode, the transmission line appears much like a normal transmission line in that the only current flowing across the A-K gap is displacement current (D). Behind the pulse front, the electron flow is insulated and thus is parallel to the anode and cathode. The region where pulse from sharpening occurs is marked by J loss +D. D is the usual displacement current, but J loss is the leakage electron current flow due to explosive plasma formation. In this region, the impressed magnetic field (formed by current propagating parallel to the cathode face) is not large enough to insulate, and the electrons are free to flow to the anode, thus eroding the pulse front.

Two basic processes limit the thinness of this pulse front. The first is that the minimum electric field for explosive plasma formation must be exceeded. The second is the time required for this plasma to become dense enough and to expand sufficiently to provide the electron current. A possible third physical process which can shorten the pulse risetime is ultraviolet radiation from electron leakage earlier in time from the current diversion switch area (to be described) and the beginning of the transmission line. Ultraviolet light impinging on the cathode surface can free electrons via the photoelectric effect. Therefore, a source of electrons (which may be small) is available for pulse front erosion before the pulse arrives.

Another process which helps shorten the risetime is that an electromagnetic precursor, which precedes the main pulse, could conceivably start the explosive plasma formation. Together, these processes result in a subnanosecond risetime pulse.

Figure 8:
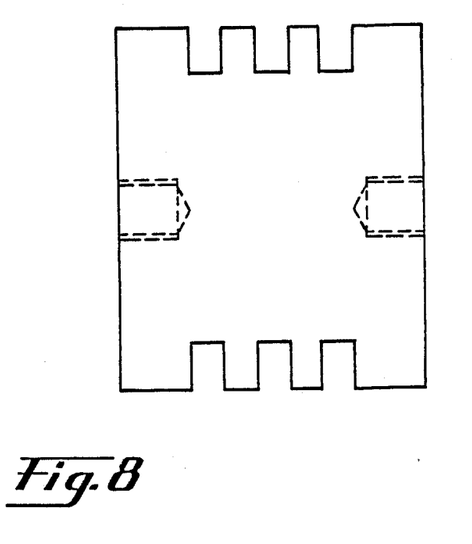
FIG. 8 is a detailed view of the PVC rod used in an embodiment of the present invention.

The first major step towards a fast risetime pulse was the development of the current diversion switch shown in FIG. 1. This switch 220 includes a rod 221 made of polyvinyl chloride (PVC) and is typically 8.9 to 10.2 cm long. Its exceptional risetime (3–5 ns) is due to: a high voltage hold-off; the existence of an alternate path for current flow early in time; and the use of self magnetic insulation from this current flow to redirect the current across the switch and into the transmission line at a later time. This switch is easy to build and reliable to operate. FIG. 8 is a detailed view of the PVC rod used in one embodiment of the present invention.

For further description of dielectric switches and their design, the reader is directed towards the text entitled "Solid State Electronic Devices" by B. G. Streetman, published by Prentice-Hall Inc., New Jersey, 1980, the disclosure of which is specifically incorporated by reference.

Figure 9:
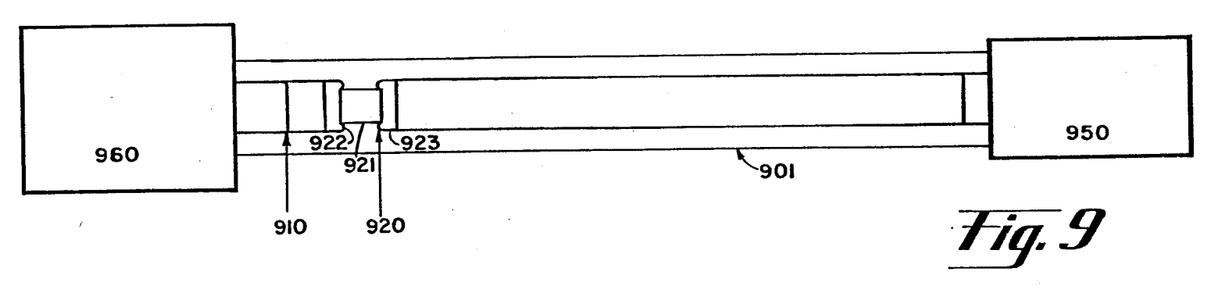
FIG. 9 is an illustration of another embodiment of the invention.

FIG. 9 is an illustration of another embodiment of the present invention.

In the system of FIG. 9, the pulse generator is a Physics International (PI) 415 generator. Therefore, the inner and outer conductors in FIG. 9 are magnetically insulated pulselines in which a vacuum is maintained between $3.0 \times 10^{-3}$ Torr and $9.0 \times 10^{-5}$ Torr. However, the system can be pulsed with pressures of up to $2.0 \times 10^{-4}$ Torr if necessary. It is believed that the conventional use of Marx/pulseline generators need not be described in further detail. The present invention is adapted for use with such pulselines as described below.

In principle, the pulse sharpening MITL of FIG. 9 is applicable to any low or medium impedance ($\leq 50$ ohm, $\geq 500$ kV) Marx/pulseline generator. The generator 960 used in FIG. 9 is a Physics International (PI) 415 generator. Its nominal output characteristics are 1 MV and 50 kA for 80 ns. The pulseline has a two-way transit time of 30 ns, but the output interface is so inductive (approximately 150 nH) that the effective output pulse length is 80 ns.

The transmission line has an outer shell 901 which is composed of Air Force Weapons Laboratory (AFWL) standard 8 inch sections which have a 7.75 inch (197. cm) inner diameter and which are 10 inches (25.4 cm) long.

Figure 10:
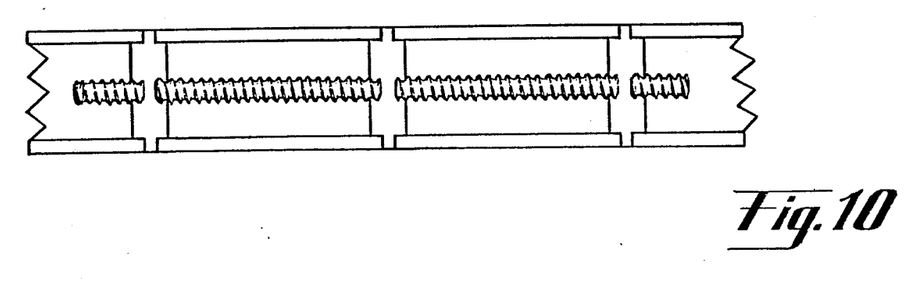
FIG. 10 is an illustration of the inner conductor used in FIG. 9.

The inner conductor assembly 910 is illustrated in FIG. 10, and consists of one to four segments of 4 inch (10.2 cm) outer diameter stainless steel pipe in 2 foot (0.61 m) sections. Adapters on either side of a section are fastened together by a long length of threaded rod. Two sections are joined simply by using a common adapter between the sections. Velvet is placed around these sections to improve the electron emission characteristics. The threaded rod 900 is also used to connect the inner conductor to the PVC rod of FIG. 8 on either side of the PVC switch 920. Note that the PVC rod 921 has corona range 922 and 923 on either side of it to complete the PVC switch assembly 920.

As discussed above, there are two switches present in the system. The upstream switch is called the current diversion switch. It is made from 7.6 cm outer diameter PVC solid rod stock. Typical lengths range from 8.9 cm to 10.2 cm. Corona rings with 0.635 radius of curvature extend 2.5 cm over the PVC on either end. The 13–20 cm of velvet covered transmission line preceding the PVC section connects the pulse generator 960 to this switch.

The downstream switch is a simple 15.24 cm inner diameter, 1.3 cm wide aluminum ring 230. On some runs, a 2.5 cm brass shim stock (0.13 cm thick) lined the inner diameter of this ring to increase its effective width.

This ring switch which is placed near the end of the MITL is shown in FIG. 1. This ring is made from aluminum and its inner diameter (15.24 cm) is smaller than the anode diameter (19.7 cm) and its thickness ranges from 1.3 to 2.5 cm. Faster erosion of the pulse front is due to smaller A–K gap and a higher electric field at the cathode surface. Thus the threshold electric field for explosive plasma formation is achieved quicker. Although there is an improvement in risetime, it is at the expense of efficient current transport, and thus it need not be used for the MITL to successfully function.

There are a variety of applications for electrical pulses with high rates of rise. These include beam propagation in the atmosphere, where fast rising pulses can generate avalanche ionization, EMP, accelerator injection, high power microwave generation, particle acceleration techniques, and radiation effects studies. The present invention includes a system for producing fast rise pulses using an existing pulsed power generator.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A pulse enhancing system which electrically connects a pulse generator with a load, said pulse enhancing system receiving an electrical pulse which has a certain voltage and current risetime from said pulse generator and outputting an enhanced pulse in which the voltage and current risetime is decreased, said pulse enhancing system comprising:

an outer conductor which electrically connects said pulse generator with said load;

a first magnetically-insulated inner conductor which is electrically connected with said pulse generator and which receives said electrical pulse from said pulse generator, said first magnetically-insulated inner conductor being separated from said outer conductor by a first covering of magnetic insulation, said first covering enabling said first magnetically-insulated inner conductor to divert an initial radial electron flow of said electrical pulse into a first axial flow of current, said first magnetically-insulated inner conductor automatically producing a first improved electrical pulse with a first reduced voltage and current risetime, as said initial radial electron flow of the electrical pulse is diverted into said first axial flow of current;

a current diverter switch which receives and retransmits said first improved electrical pulse from said first magnetically-insulated conductor, said current diverter switch thereby producing a retransmitted pulse; and a second magnetically-insulated inner conductor which electrically connects said current diverter switch to said load, said second magnetically-insulated inner conductor receiving said retransmitter pulse from said current diverter switch, and being separated from said outer conductor by a second covering of magnetic insulation, said second covering enabling said second magnetically-insulated inner conductor to divert initial radial electron flow of said retransmitted pulse into a second axial flow of current, said second magnetically-insulated inner conductor automatically producing said enhanced pulse to said load in which the voltage and current risetime is decreased, as said initial radial flow of said retransmitted pulse is diverted into said second axial flow of current.

2. A pulse enhancing system, as defined in claim 1, wherein said first and second magnetically-insulated inner conductors are each covered with a wrapping of velvet cloth which separates them from said outer conductor, said velvet cloth having a threshold electric field required for electron emission of about 50 kV/cm which provides sufficient magnetic insulation to divert the initial radial electron flow of said electrical pulse into first and second said axial flow of current and thereby provide said reduced voltage and current risetime in electrical pulses from said pulse generator.

3. A pulse enhancing system, as defined in claim 2, wherein said current diverter switch comprises a polyvinyl chloride dielectric flashover switch which electrically connects said first and second magnetically-insulated inner conductors.

4. A pulse enhancing system, as defined in claim 3, including a ring switch which circumscribes said outer conductor near said load, said ring switch being an aluminum ring having an inner diameter smaller than that of said outer conductor and producing a smaller anode-cathode gap between said outer conductor and said second magnetically-insulated inner conductor, said smaller anode-cathode gap producing thereby a faster erosion of pulse fronts of electrical signals conducted through the pulse enhancing system, said faster erosion of pulse fronts thereby producing an improvement in risetimes in said electrical signals.

5. A pulse enhancing system, as defined in claim 4, wherein said current diverter switch comprises:
a polyvinyl chloride dielectric rod which is electrically connected between said first and second magnetically-insulated inner conductors; and
first and second corona rings which respectively connect said polyvinyl chloride dielectric rod to said first and second magnetically insulated inner conductors.

* * * * *